United States Patent [19]
Hong

[11] Patent Number: 5,481,128
[45] Date of Patent: Jan. 2, 1996

[54] STRUCTURE FOR FLASH MEMORY CELL

[75] Inventor: Gary Hong, Hsinchu, Taiwan

[73] Assignee: United Microelectronics Corporation, Hsinchu, Taiwan

[21] Appl. No.: 426,493

[22] Filed: Apr. 20, 1995

Related U.S. Application Data

[60] Continuation of Ser. No. 195,099, Feb. 14, 1994, abandoned, which is a division of Ser. No. 94,744, Jul. 22, 1993, Pat. No. 5,298,447.

[51] Int. Cl.$^6$ .......................... H01L 29/788; H01L 29/68
[52] U.S. Cl. .................... 257/320; 257/64; 257/324; 257/325; 257/646
[58] Field of Search ...................... 257/646, 320, 257/324, 325, 64

[56]  References Cited

U.S. PATENT DOCUMENTS 3,649,884  3/1972  Haneta ................................ 257/325
4,253,106  2/1981  Goldsmith et al. .................... 257/325
4,688,078  8/1987  Hseih ................................... 257/320
4,717,943  1/1988  Wolf et al. ............................ 257/324
4,748,133  5/1988  Griswold .............................. 257/52
5,229,631  7/1993  Woo .................................... 257/321
5,284,786  2/1994  Sethi ................................... 257/321
5,289,026  2/1994  Ong ..................................... 257/321
5,331,185  7/1994  Chan et al. ........................... 257/320

Primary Examiner—Sara W. Crane
Assistant Examiner—Alice W. Tang
Attorney, Agent, or Firm—George O. Saile; Graham S. Jones, II

[57]  ABSTRACT

A flash memory cell includes the usual thermal oxide layer deposited above the substrate including the source and the drain. On the thermal oxide layer, a silicon rich oxide layer is formed. Above the silicon rich oxide layer a gate structure is formed of layer of polysilicon separated by an intermediate dielectric layer. The lower polysilicon layer commences as an initial portion of the layer of small grain size followed by either amorphous or large grain size material.

7 Claims, 1 Drawing Sheet

STRUCTURE FOR FLASH MEMORY CELL

This application is a continuation of application Ser. No. 08/195,099, filed Feb. 14, 1994, now abandoned which is a division of application Ser. No. 08/94,744, filed Jul. 22, 1993, now U.S. Pat. No. 5,298,447.

BACKGROUND OF THE INVENTION

1. Field of the Invention

This invention relates to FET memory cells and more particularly to flash memory cells.

2. Description of Related Art

A conventional FLASH memory cell, such as an ETOX (Eprom with Tunnel Oxide) cell uses a self-aligned double polysilicon (poly) structure as shown in FIG. 1 in which a substrate of semiconductor material 10 has been doped in the conventional way to form a source 11 and a drain 12. The semiconductor material 10 including the source 11 and drain 12 is coated with a tunnel oxide thin film 14. A gate structure 16 is formed on top of the tunnel oxide film 14. The first layer of the gate structure is a first polysilicon layer 18, referred to hereinafter as "poly 1" carrying an intermediate dielectric layer 19. An upper layer 25 comprises a second poly layer "poly 2."

A conventional flash memory cell has the disadvantage of critical thin dielectric in the form of a tunnel oxide for "F-N" (Fowler-Norheim) tunneling. The tunnel oxide must be thin (~100Å) for F-N tunneling to provide erasing. Therefore, the reliability i.e., $Q_{Bd}$ (charge to breakdown) is a serious concern. Also, the thin tunnel oxide results in a poor coupling ratio for memory cell characteristics.

SUMMARY OF THE INVENTION

In accordance with this invention a self-aligned flash MOS field effect transistor is provided comprising:

a) a silicon semiconductor substrate having an upper surface, b) a source region and a drain region formed in the substrate on the surface, c) a tunnel oxide structure deposited over the surface of the substrate including the surface of the source and the drain regions, d) the tunnel oxide structure including a thermal oxide layer deposited upon the substrate and a film of silicon rich oxide deposited upon the thermal oxide layer, and e) a gate structure composed of a stack deposited upon the silicon rich oxide film, the stack comprising a first polysilicon layer, a dielectric layer deposited upon the polysilicon layer and a second polysilicon layer deposited upon the dielectric layer.

Preferably, in the transistor structure, the first polysilicon layer of the gate structure preferably includes a lower portion composed of relatively smaller grain size crystals, and an upper portion composed of a structure composed of larger grain size crystals.

Preferably, the first polysilicon layer includes a first portion and a second portion, wherein the first portion has a thickness of between about 300Å and about 600Å thick and the second portion is between about 1000Å and about 2000Å thick.

Preferably a native polyoxide is provided as a boundary between the lower portion and the upper portion of the first polysilicon layer; and the dielectric layer comprises oxide-nitride oxide.

It is further preferred that the oxide-nitride-oxide is formed by a thin thermal oxide of about –80Å followed by the layer of nitride deposited by LPCVD –100Å and final oxide layer between about 20Å and about 50Å.

Preferably the transistor structure includes a substrate with a source Junction and a drain Junction therein and a tunnel oxide structure deposited thereon, the improvement comprising, the tunnel oxide comprising a thermal oxide layer deposited upon the semiconductor substrate and a silicon-rich-oxide layer deposited upon the thermal oxide layer, and a flash memory gate structure deposited upon the silicon-rich-oxide layer.

Preferably the thickness of the silicon rich oxide layer is within the range between about 50Å and about 200Å and the thickness of the thermal oxide layer is within the range between about 50Å and about 100Å.

Preferably, the silicon rich oxide has been deposited by chemical vapor deposition.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention is based on an ETOX cell and pertains to the building of an improved, optimized and manufacturable flash memory cell by modifying poly 1 and tunnel oxide structures with a multilayer polysilicon layer and "silicon rich-oxide" (SRO) to enhance flash erasing speed, EPROM coupling ratio and to obtain good charge retention ability.

Figure 1:
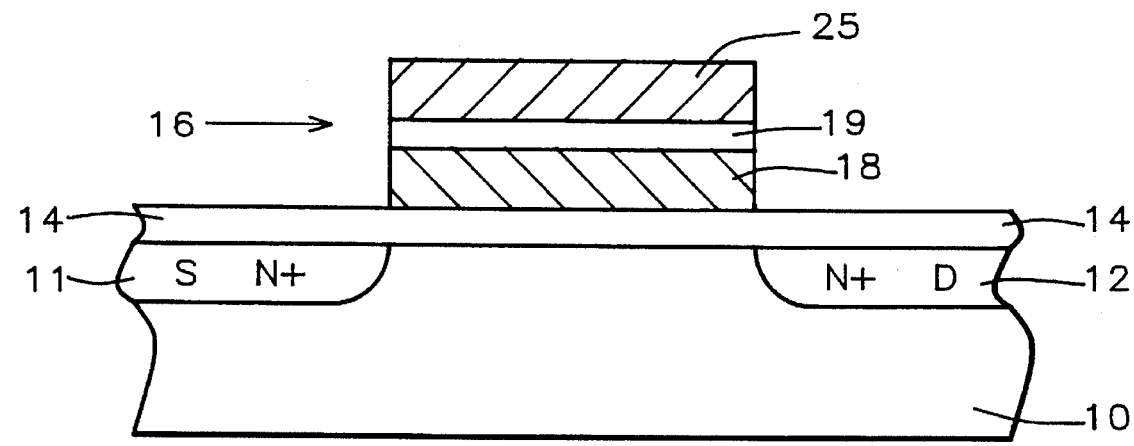
FIG. 1 shows a prior art flash memory cell with the usual thermal oxide layer (deposited above the source and drain) on which a gate structure is formed of layers of polysilicon separated by an intermediate dielectric layer.

Optimization of the structure of poly 1 layer 18 in FIG. 1 to alter its property for flash erasing and charge retention is a dilemma.

In accordance with this invention, large grain size and a smooth surface for poly 1 is effective to provide an intermediate layer of "interpoly dielectric" which provides for improved charge retention. However, small poly 1 grain size or poly asperities will favor flash erasing speed.

Figure 2:
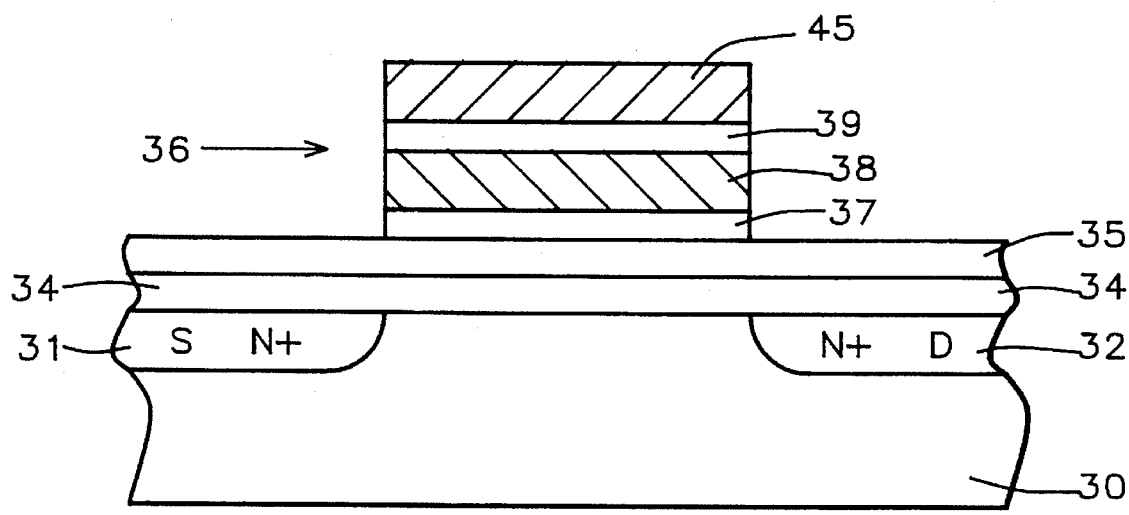
FIG. 2 shows an improvement in the structure of FIG. 1 wherein a flash memory cell in accordance with this invention includes a silicon rich oxide layer above the thermal oxide layer, and a modification of the lower layer of polysilicon in which there is an initial layer of small grain size followed by either a large grain size, smooth phase of silicon material or a large grain size material.

The detailed cell structure of this invention is shown in FIG. 2, wherein a substrate of semiconductor material 30 composed of lightly doped silicon is doped in the conventional way to form a source 31 and a drain 32. The semiconductor material 30, including the source 31 and drain 32, is coated with a thin film 34 of tunnel oxide (thermal oxide.) In the case of the instant invention, a new "SRO" (Silicon Rich Oxide) film 35 is deposited upon the tunnel oxide film 34. A gate structure 36 is deposited upon the tunnel oxide film 34. A gate structure 36 is formed on top of the SRO film 35. The first layer of the gate structure 36 is a bottom "poly 1" layer 37 with small grain size followed by a top layer 38 which is either a large grain size, smooth phase of silicon or is large grain size polysilicon. Layers 37 and 38 form a floating gate structure. Layer 38 of the floating gate carries an intermediate dielectric layer 39. An upper layer 45 comprising a control gate is a second polysilicon layer referred to hereinafter as "poly 2."

The tunnel oxide layer 34 comprises a thermal oxide layer. The silicon-rich-oxide (SRO) layer 35 upon thermal oxide layer 34 is preferably deposited by a chemical vapor deposition (CVD) process. The floating gate 37, 38 is constructed with a double-layer structure. The bottom layer 37 of poly 1 is a thin layer (300–600Å) and the top layer 38 is a thicker layer (1000–2000Å) and is formed by a different process, as described below.

The flash erasing involves use of a high voltage across poly 2 45 and the S/D Junction or substrate, the electrons stored in floating gate 37, 38 are pulled out through tunnel oxide by the F-N tunnel effect. The purpose of the SRO layer 35 is to enhance the erasing speed by enhanced electron injection from the higher electric field at the surface of silicon islands in the SRO layer 35. The thin thermal oxide layer 34 maintains the high quality of the interface between the SRO layer 35 and the surface of semiconductor 30 composed of lightly doped silicon. The thickness of SRO layer 35 can be between about 50–200Å and the thickness of thermal oxide layer 34 can be 50–100Å.

The total tunnel oxide thickness (SRO 34 plus thermal oxide 35) will be thicker than that of a conventional tunnel oxide and still have higher F-N tunneling current and erasing speed. The thicker tunnel oxide will result in better $Q_{Bd}$ and high coupling ratio for EPROM programming and read characteristics. The multilayers 35 and 37 are provided to enhance the flash erasing and charge retention characteristics. The two layers 35 and 37 can be optimized in terms of polysilicon grain size, etc. to enhance erasing and to obtain good charge retention characteristics.

The bottom thinner "poly 1" layer 37 is deposited by LPCVD at temperatures of ~630° C. and is lightly doped with impurities which result in a smaller grain size of polysilicon with a considerable quantity of asperities (i.e. sharp corners.) The abundant grain boundaries and asperities enhance the electric field and consequently enhance the erasing speed.

The top thicker layer 38 is deposited by LPCVD with lower temperature of ~560° C. and hence forms a large grain size, smooth phase of silicon. The inter poly dielectric can be thermal oxide or ONO (oxide-nitride-oxide.) The ONO is formed by a thin thermal oxide (~80Å) followed by LPCVD of nitride (~100Å) and final thermal oxidation or CVD oxide (20Å–50Å.)

This interpoly dielectric layer 39 is formed on the surface of the smoother layer 38, resulting in the property of good electrical isolation and hence low leakage current and good capacity for charge retention of the charge stored in the poly 1 layers 37, 38 after EPROM programming. Furthermore, the formation process of inter-poly dielectric layer 39 must be chosen so as to leave the top layer 38 with silicon of the large grain size, smooth phase. The boundary between the two layers 37 and 38 can be native polyoxide, that is a good interrupting material for grain growth and is a good conducting interface between layers 37 and 38, as well.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A self-aligned flash memory MOS field effect transistor device comprising:

a silicon semiconductor substrate having an upper surface, a source region and a drain region formed in said substrate on said upper surface, a tunnel oxide structure formed over the surface of said substrate including said surface over said source and said drain regions, said tunnel oxide structure including only two layers comprising a thermal oxide layer having a thickness between about 50Å and about 100Å formed upon said substrate and a film of silicon rich oxide having a thickness between about 50Å and about 200Å formed upon said thermal oxide layer, and a gate structure composed of a stack formed upon said silicon rich oxide film, said stack comprising a floating gate electrode, a dielectric layer formed upon said floating gate layer and a control electrode polysilicon layer formed upon said dielectric layer, said floating gate electrode of said gate structure including a lower portion composed of relatively smaller grain size crystals with substantial asperities and having a thickness between about 300Å and about 600Å, and an upper portion having a thickness between about 1,000Å and about 2,000Å of having a smoother surface than said lower portion, said lower portion of said floating gate electrode of said gate structure comprising a polysilicon structure formed by LPCVD at a temperature of about 630° C. and said upper portion of said floating gate electrode comprising silicon with a large grain size and a smooth surface.

2. A transistor structure in accordance with claim 1 wherein a native polyoxide is provided as a boundary between said lower portion and said upper portion of said floating gate electrode, whereby there is provided a good interrupting material for grain growth and a good conducting interface between silicon layers.

3. A self-aligned flash memory MOS field effect transistor device comprising:

a silicon semiconductor substrate having an upper surface, a source region and a drain region formed in said substrate on said upper surface, a tunnel oxide structure formed over the surface of said substrate including said surface over said source and said drain regions, said tunnel oxide structure including only two layers comprising a thermal oxide layer having a thickness between about 50Å and about 100Å formed upon said substrate and a film of silicon rich oxide having a thickness between about 50Å and about 200Å formed upon said thermal oxide layer, and a gate structure composed of a stack formed upon said silicon rich oxide film, said stack comprising a floating gate electrode, a dielectric layer formed upon said floating gate layer and a control electrode polysilicon layer formed upon said dielectric layer, said floating gate electrode of said gate structure including a lower portion composed of relatively smaller grain size crystals with substantial asperities and having a thickness between about 300Å and about 600Å, and an upper portion with larger grain size crystals having a thickness between about 1,000Å and about 2,000Å of polysilicon having a smoother surface than said lower portion, whereby flash memory erasing speed is enhanced with concomitant increased tunnel oxide thickness.

4. A self-aligned flash memory MOS field effect transistor structure comprising:
   a) a silicon semiconductor substrate having an upper surface,
   b) a source region and a drain region formed in said substrate on said upper surface,
   c) a tunnel oxide structure deposited over the surface of said substrate including said surface over said source and said drain regions,
   d) said tunnel oxide structure including only two layers comprising a thermal oxide layer formed upon said substrate and a film of silicon rich oxide formed upon said thermal oxide layer,
   said tunnel oxide structure including a thermal oxide layer having a thickness between about 50Å and about 100Å formed upon said substrate and a film of silicon rich oxide having a thickness between about 50Å and about 200Å formed upon said thermal oxide layer, and
   e) a gate structure composed of a stack formed upon said silicon rich oxide film, said stack comprising a first polysilicon layer, a dielectric layer formed upon said polysilicon layer and a second polysilicon layer formed upon said dielectric layer,
   said first polysilicon layer of said gate structure including a lower portion composed of relatively smaller grain size crystals with asperities, and an upper portion composed of polysilicon having a smoother surface than said lower portion, said first polysilicon layer having a thickness between about 300Å and about 600Å, and said upper portion having larger grain size crystals with a thickness between about 1,000Å and about 2,000Å of polysilicon having a smoother surface than said lower portion, whereby flash memory erasing speed is enhanced with concomitant increased tunnel oxide thickness.

5. A transistor structure in accordance with claim 1 wherein said lower portion is lightly doped with impurities which result in a smaller grain size of polysilicon with a considerable quantity of said asperities,
   whereby abundant grain boundaries and asperities enhance the electric field and consequently enhance the erasing speed.

6. A transistor structure in accordance with claim 1 wherein said dielectric layer comprises oxide-nitride oxide.

7. A transistor structure in accordance with claim 6 wherein said oxide-nitride-oxide is formed by thin thermal oxide layer of about 80Å followed by a layer of nitride formed by LPCVD of about 100Å and final oxide layer between about 20Å and about 50Å.

* * * * *